(12) United States Patent
Katrak et al.

(10) Patent No.: US 8,396,680 B2
(45) Date of Patent: Mar. 12, 2013

(54) SYSTEM AND METHOD FOR IDENTIFYING ISSUES IN CURRENT AND VOLTAGE MEASUREMENTS

(75) Inventors: Kerfegar K. Katrak, Fenton, MI (US); Andrew H. Leutheuser, Royal Oak, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 469 days.

(21) Appl. No.: 12/254,653

(22) Filed: Oct. 20, 2008

(65) Prior Publication Data

US 2010/0100345 A1    Apr. 22, 2010

(51) Int. Cl.
G01R 19/10 (2006.01)
G01R 31/02 (2006.01)
H02H 3/40 (2006.01)

(52) U.S. Cl. .............................. 702/65; 361/88; 324/522
(58) Field of Classification Search .................... 702/65; 361/88; 324/522
See application file for complete search history.

(56) References Cited

U.S. PATENT DOCUMENTS

| | | | |
|---|---|---|---|
| 6,479,908 B1 | 11/2002 | Utter et al. | |
| 6,580,277 B1 * | 6/2003 | Bolz .............................. | 324/608 |
| 6,739,314 B1 | 5/2004 | Bauerle et al. | |
| 6,808,471 B1 | 10/2004 | Bauerle et al. | |
| 6,810,853 B1 | 11/2004 | Wong et al. | |
| 6,843,229 B2 | 1/2005 | Bauerle et al. | |
| 6,957,140 B1 | 10/2005 | Bauerle et al. | |
| 6,999,870 B2 | 2/2006 | Katrak et al. | |
| 7,027,914 B2 | 4/2006 | Katrak et al. | |
| 7,042,363 B2 | 5/2006 | Katrak et al. | |
| 7,069,773 B2 | 7/2006 | Stempnik et al. | |
| 7,081,193 B2 * | 7/2006 | Dewey et al. .................. | 205/337 |
| 7,082,925 B2 | 8/2006 | Katrak et al. | |
| 7,089,105 B2 | 8/2006 | Katrak et al. | |
| 7,101,312 B2 | 9/2006 | Bauerle et al. | |
| 7,122,993 B2 | 10/2006 | Bauerle et al. | |

(Continued)

FOREIGN PATENT DOCUMENTS

DE    10215404 A1    10/2003
DE    102004058540 A1    6/2006

OTHER PUBLICATIONS

Katrak, K.K., and Thomas, J.K., U.S. Appl. No. 11/750,351 entitled "Secure Data Strategy for Vehicle Control Systems," filed May 18, 2007.

(Continued)

*Primary Examiner* — Jonathan C Teixeira Moffat
*Assistant Examiner* — Regis Betsch
(74) *Attorney, Agent, or Firm* — Ingrassia Fisher & Lorenz, P.C.

(57) ABSTRACT

First and second reference voltages are applied to first and second terminals of a processor via voltage divider circuits. First and second signal conditioning circuits are coupled to third and fourth terminals of the processor, respectively, and voltage or current sensors are coupled to the first and second signal conditioning circuits. The processor measures the electrical characteristics at the third and fourth terminals and computes first and second ratiometric values of the electrical characteristics, wherein the first ratiometric value is based upon a measurement obtained from the third terminal and the first reference voltage and the second ratiometric value is based upon a measurement of obtained from the fourth terminal and the second reference voltage. The processor further identifies an issue if a ratio of the first ratiometric value to the second ratiometric value exceeds a ratio of the first reference value to the second reference value.

20 Claims, 6 Drawing Sheets

U.S. PATENT DOCUMENTS

| | | | |
|---|---|---|---|
| 7,126,463 | B2 | 10/2006 | Bauerle et al. |
| 7,142,132 | B2 | 11/2006 | Katrak et al. |
| 7,200,469 | B2 | 4/2007 | Katrak et al. |
| 7,242,329 | B2 | 7/2007 | Katrak |
| 7,269,491 | B2 | 9/2007 | Katrak et al. |
| 7,277,265 | B2 | 10/2007 | Katrak et al. |
| 7,278,952 | B2 | 10/2007 | Bauerle et al. |
| 7,305,295 | B2 | 12/2007 | Bauerle et al. |
| 7,306,542 | B2 | 12/2007 | Bauerle et al. |
| 7,307,561 | B2 | 12/2007 | Haag et al. |
| 7,340,337 | B2 | 3/2008 | Katrak |
| 7,343,897 | B2 | 3/2008 | Katrak et al. |
| 7,383,120 | B2 | 6/2008 | Stockbridge et al. |
| 2002/0005738 | A1* | 1/2002 | Inn .................................. 327/51 |
| 2006/0082386 | A1 | 4/2006 | Katrak et al. |
| 2006/0085143 | A1 | 4/2006 | Katrak et al. |
| 2006/0126256 | A1 | 6/2006 | Forest et al. |
| 2006/0131963 | A1 | 6/2006 | Katrak et al. |
| 2006/0145541 | A1 | 7/2006 | Katrak et al. |
| 2006/0167565 | A1 | 7/2006 | Katrak et al. |
| 2006/0176197 | A1* | 8/2006 | McNeill et al. ............... 341/120 |
| 2006/0179366 | A1 | 8/2006 | Katrak et al. |
| 2006/0179962 | A1 | 8/2006 | Katrak et al. |
| 2006/0190142 | A1 | 8/2006 | Katrak et al. |
| 2006/0287777 | A1 | 12/2006 | Katrak et al. |
| 2006/0287790 | A1 | 12/2006 | Seifert et al. |
| 2007/0024910 | A1 | 2/2007 | Katrak et al. |
| 2007/0027603 | A1 | 2/2007 | Katrak |
| 2007/0038917 | A1 | 2/2007 | Forest et al. |
| 2007/0101236 | A1 | 5/2007 | Bauerle et al. |
| 2007/0294007 | A1 | 12/2007 | Katrak |
| 2008/0065292 | A1 | 3/2008 | Katrak et al. |
| 2008/0065294 | A1 | 3/2008 | Katrak et al. |
| 2008/0082234 | A1 | 4/2008 | Majersik et al. |
| 2008/0157951 | A1 | 7/2008 | Katrak et al. |
| 2008/0168317 | A1 | 7/2008 | Katrak |
| 2008/0208410 | A1 | 8/2008 | Katrak et al. |

OTHER PUBLICATIONS

Katrak, K.K., and Bolio, R.R., U.S. Appl. No. 11/759,395 entitled "Parametric Remedial Action Strategy for an Active Front Steer System," filed Jun. 7, 2007.

K.K., Thomas, J.K., Kondel, T.M., and Dykas, M., U.S. Appl. No. 11/734,421 entitled "Method and Apparatus for Validating Processors Using Seed and Key Tests," filed Apr. 12, 2007.

Katrak, K.K., Chandra, H., and Wellsand, T.A., U.S. Appl. No. 11/873,290 entitled "Method and System for Testing Address Lines," filed Oct. 16, 2007.

Bolio, R.R., Feller, R., and Katrak, K.K., U.S. Appl. No. 11/872,185 entitled "Methods and Systems for Controlling Steering in a Vehicle Using a Primary Active Steering Functionality and a Supplemental Active Steering Functionality," filed Oct. 15, 2007.

Katrak, K.K., Leutheuser, A.H., and Martin, S.A., U.S. Appl. No. 11/935,684 entitled "Multi-Cell Voltage Secure Data Encoding in Hybrid Vehicles," filed Nov. 6, 2007.

Katrak, K.K., U.S. Appl. No. 12/203,805 entitled "Methods and Systems for Securing Vehicle Data," filed Sep. 3, 2008.

Katrak, K.K., Wolak, J.T., and Kissel, G.J., U.S. Appl. No. 12/203,787 entitled "Methods and Systems for Providing Communications Between a Battery Charger and a Battery Control Unit for a Hybrid Vehicle," filed Sep. 3, 2008.

Katrak, K.K., and Bauerle, P.A., U.S. Appl. No. 60/459,899 entitled "Methods and Apparatus for Producing a Three-State Single Wire Control," filed Apr. 3, 2003.

Bauerle, P.A., Katrak, K.K., and Stockbridge, J.N., U.S. Appl. No. 60/491,903 entitled "PWM and Variable Frequency Based Position Indicators," filed Aug. 1, 2003.

Stockbridge, J.N., Katrak, K.K., and Bauerle, P.A., U.S. Appl. No. 60/491,700 entitled "Methods and Apparatus for Adjusting Frequency and/or PWM-Based Sensors," filed Aug. 1, 2003.

Katrak, K.K., and Bauerle, P.A., and Stockbridge, J.N., U.S. Appl. No. 60/491,905 entitled "Variable Frequency Based Accelerator Pedal Module and Electronic Throttle Body Position Indicators," filed Aug. 1, 2003.

Katrak, K.K., Stockbridge, J.N., Costin, M.H., Shcaller, R.J., Hartrey, T.J., Worthing, J.L., Bauerle, P.A., and Rogers,B.A., U.S. Appl. No. 60/565,697 entitled "Electronic Throttle Control with Throttle Position Sensor System and Air Flow Indicators," filed Apr. 26, 2004.

Forest, T.M., and Katrak, K.K., U.S. Appl. No. 60/636,768 entitled "Dual Processor Supervisory Control System for a Vehicle," filed Dec. 15, 2004.

Katrak, K.K., U.S. Appl. No. 60/649,851 entitled "Method and System for Prioritizing Data Values for Robust Data Representation," filed Feb. 2, 2005.

Katrak, K.K., and Turski, M.P., U.S. Appl. No. 60/649,982 entitled "Methods and Systems for Secure Control of System Modes and Sub-Modes," filed Feb. 4, 2005.

Katrak, K.K., Forest, T.M., and Thomas, J.K., U.S. Appl. No. 60/703,651 entitled "Secure Serial Data Communication Dual Path Method," filed Jul. 29, 2005.

Katrak, K.K., Tan,H., Sidlosky, D.M., and Kondel, T.M., U.S. Appl. No. 11/764,869 entitled "Operation of Electronic Stability Control Systems Using Data from a Plurality of Sources," filed Jun. 19, 2007.

Katrak, K.K., and Palazzolo, S.D., U.S. Appl. No. 11/692,959 entitled "Vehicle Data Security Method and System," filed Mar. 29, 2007.

German Office Action for German Application No. 10 2009 047 856.6-35 mailed Jan. 21, 2011.

* cited by examiner

SYSTEM AND METHOD FOR IDENTIFYING ISSUES IN CURRENT AND VOLTAGE MEASUREMENTS

TECHNICAL FIELD

This document generally relates to measuring electrical characteristics such as currents and voltages. More particularly, this document describes systems and methods for identifying issues that may occur during current and voltage sensing with an analog-to-digital converter.

BACKGROUND

In recent years, so-called "hybrid vehicles" have become increasingly popular. These vehicles typically use one or more motors to assist the brakes while decelerating and assist the internal combustion engine while accelerating thereby dramatically reducing fuel consumption without significant effects upon the driving experience. The motors are used to convert between electrical and mechanical energy. When the electrical energy is generated by a motor it is stored with a rechargeable energy storage system (RESS) or the like that includes a battery pack. In addition to currently-available hybrid vehicles, a number of vehicles are designed such that they can be re-charged from the electrical grid or another source.

During operation of a RESS or other battery-powered system, it is generally desirable to monitor the current and voltage provided by the battery. Presently, current and voltage measurements are obtained using two separate channels of a microprocessor; a first channel for measuring voltage, and a second for measuring current. While this arrangement is generally able to provide accurate measurements under most conditions, it is not typically a redundant arrangement, and therefore it lacks the security commonly found in many components. If an irregularity should occur in an analog-to-digital converter, reference voltage or other non-redundant component found in conventional systems, this irregularity would be relatively difficult to identify.

Accordingly, it is desirable to provide improved systems and techniques for measuring currents, voltages and/or other electrical characteristics that provide accurate measurements, and that are able to recognize issues that may arise within the measurement environment. Furthermore, other desirable features and characteristics of the present invention will become apparent from the subsequent detailed description and the appended claims, taken in conjunction with the accompanying drawings and the foregoing technical field and background.

SUMMARY

According to various exemplary embodiments, methods and systems are provided for identifying issues associated with sensing of electrical characteristics in a processor having first, second, third and fourth terminals. In one embodiment, a first reference voltage is received at the first terminal and a second reference voltage at the second terminal. First data is obtained about the electrical characteristics from the third terminal and second data is obtained about the electrical characteristics from the fourth terminal. A first value of the electrical characteristics is computed based upon the first data and the first reference voltage and a second value of the electrical characteristics is computed based upon the second data and the second reference voltage. A reference ratio of the first reference voltage to the second reference voltage and a value ratio of the first value to the second value are determined, and an issue is identified if the value ratio exceeds the reference ratio.

Other embodiments relate to methods of diagnosing issues in electrical characteristics comprising a current and a voltage measured by a processor having a number of terminals. A first reference value is obtained on a first terminal, and a second reference value is obtained on a second terminal. Measurements are obtained for first and second voltage measurements on separate terminals, as well as for first and second current measurement on separate terminals. A first value of the voltage is computed based upon the first voltage measurement and the first reference voltage, and a second value of the voltage is computed based upon the second voltage measurement and the second reference voltage. A first value of the current is computed based upon the first current measurement and the first reference voltage, and a second value of the current is computed based upon the second current measurement and the second reference voltage. The first reference value is compared to the second reference value, and an issue is identified if the first and second reference values differ. The first and second values of the voltage are also compared, and the issue is identified if the first and second values of the voltage differ. The first and second values of the current are also compared, and issue is identified if the first and second values of the current differ. Also, a value ratio of the first and second voltages is compared to a reference ratio of the first and second reference voltages, and the issue is identified if the value ratio exceeds the reference ratio. Also current measurements are compared in the same way the voltages are compared.

Still other embodiments provide a system for measuring electrical characteristics. First and second reference voltages are applied to first and second terminals of a processor via voltage divider circuits. First and second signal conditioning circuits are coupled to third and fourth terminals of the processor, respectively, and voltage or current sensors are coupled to the first and second signal conditioning circuits. The processor measures the electrical characteristics at the third and fourth terminals and computes first and second ratiometric values of the electrical characteristics, wherein the first ratiometric value is based upon a measurement obtained from the third terminal and the first reference voltage and the second ratiometric value is based upon a measurement of obtained from the fourth terminal and the second reference voltage. The processor further identifies an issue if a ratio of the first ratiometric value to the second ratiometric value exceeds a ratio of the first reference value to the second reference value.

Other features and aspects of various embodiments are described in additional detail below.

DESCRIPTION OF THE DRAWINGS

The subject matter will hereinafter be described in conjunction with the following drawing figures, wherein like numerals denote like elements.

DETAILED DESCRIPTION

The following description relates primarily to methods and systems associated with sensing voltages and/or currents of battery packs such as those found on many hybrid and electrical automobiles, trucks and other vehicles. Equivalent concepts, however, may be readily applied in any other vehicular, industrial, aerospace and/or other settings. In this regard, the following detailed description is merely exemplary in nature and is not intended to limit the invention or the application and uses of the invention. Furthermore, there is no intention to be bound by any expressed or implied theory presented in the preceding technical field, background, brief summary or the following detailed description.

Generally speaking, the reliability, robustness and security of a current and/or voltage measurement system is greatly improved through the use of redundant sensing channels and the computation of redundant ratiometric values based upon separate references. Moreover, by properly designing the architecture of the measurement system, any errors or other issues can be readily identified through computation of various ratios, and comparisons of such ratios to each other. Additional detail is provided below.

The following description refers to elements or nodes or features being "connected" or "coupled" together. As used herein, unless expressly stated otherwise, "connected" means that one element/node/feature is directly joined to (or directly communicates with) another element, node or other feature in a mechanical, logical, electrical or other appropriate sense. Likewise, unless expressly stated otherwise, "coupled" means that one element/node/feature is either directly or indirectly joined to (or directly or indirectly communicates with) another element/node/feature in a mechanical, logical, electrical or other appropriate sense. The term "exemplary" is used in the sense of "example," rather than "model." Further, although the figures may depict example arrangements of elements, additional intervening elements, devices, features, or components may be present in a practical embodiment of the invention.

Figure 1A:
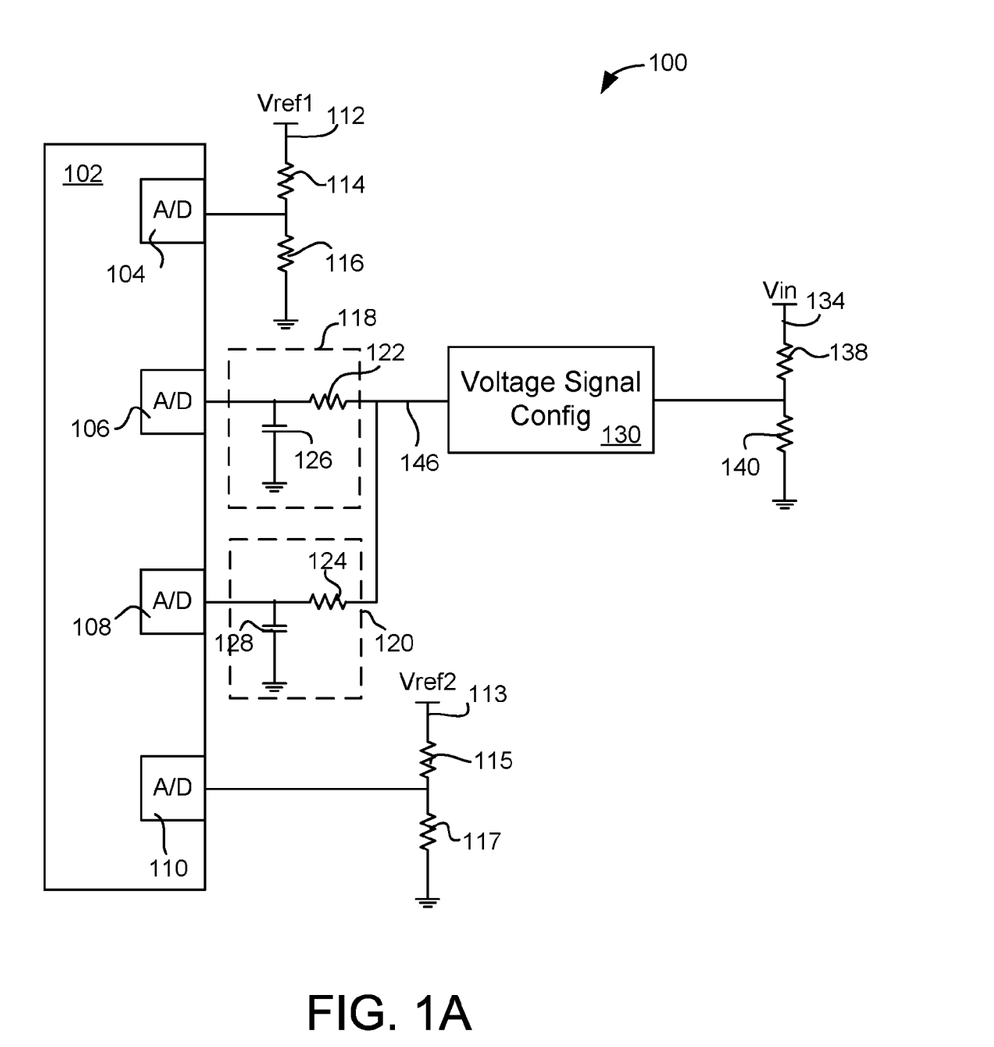
FIGS. 1A and 1B are circuit diagrams of exemplary embodiments of systems for measuring and diagnosing electrical characteristics such as voltages and currents.
Figure 1B:
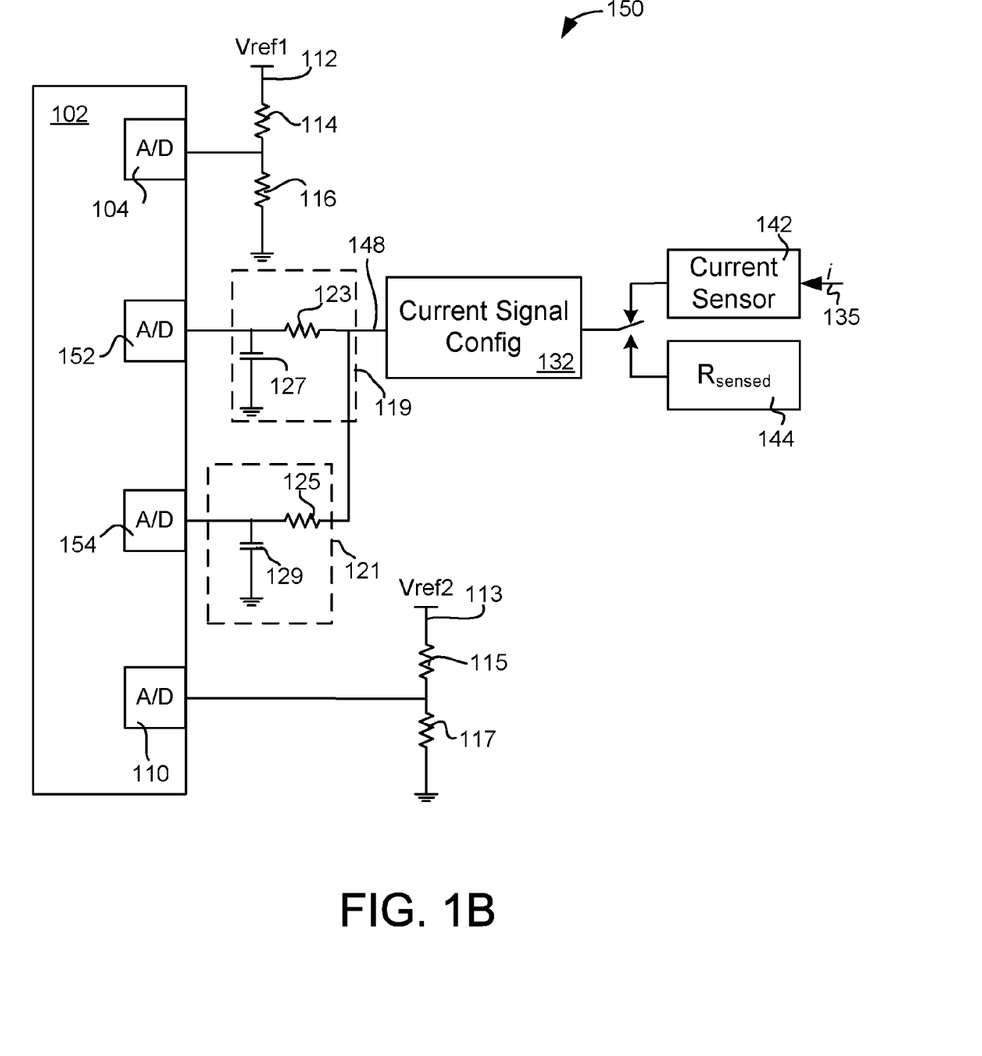

With reference now to the drawing figures and initial reference to FIG. 1A, an exemplary system 100 for measuring and evaluating electrical voltages suitably includes a processor 102, two or more circuits providing reference voltages 112, 113, and appropriate circuitry for receiving and processing voltage signals 134 received from a battery pack or other object to be monitored. In the exemplary embodiment shown in FIG. 1A, only voltage measurements are shown; alternate embodiments may be focused primarily or entirely upon sensing current, voltage, other electrical effects (e.g., impedance) and/or any combination of effects as appropriate. FIG. 1B shows an exemplary system 150 for sensing electrical currents; in practice, systems 100 and 150 may be simultaneously deployed on a common processor 102, as described more fully below.

In the systems 100 and 150 shown in FIGS. 1A and 1B, respectively, reliability is improved through several features. First, voltage is sensed on two separate terminals 106, 108 of processor 102 in FIG. 1, thereby providing redundancy. FIG. 1B similarly shows current sensed on two separate terminals 152, 154 of processor 102. In each instance, values of the measured quantity may be determined ratiometrically with respect to reference signals applied to terminals 104, 110 of processor 102, thereby providing an additional level of redundancy and also allowing for convenient verification of measurements taken through comparisons of ratios, as described more fully below.

With continued reference to FIGS. 1A and 1B, processor 102 is any device, component, circuitry, system or logic capable of sensing electrical characteristics and of processing the sensed values as described herein. In various embodiments, processor 102 is implemented with a conventional microprocessor or microcontroller capable of executing instructions stored in an associated memory or other digital storage. Processor 102 typically includes any number of terminals 104, 106, 108, 110 as shown in FIG. 1A (as well as terminals 152, 154 in FIG. 1B). In various embodiments, each of these terminals is a signal pin on a controller device with built in analog-to-digital (A/D) conversion features. In such embodiments, an analog voltage applied to the terminal can be readily converted to a digital representation of the voltage having any desired resolution. Common A/D functions available in many conventional microcontroller devices support resolutions of about ten to about fourteen bits, although other embodiments may use greater or lesser resolution as desired.

Reference voltages 112, 113 are each voltage or other electrical signals that are relatively constant and that provide reference for measurements made by processor 102. In various embodiments, reference voltages 112, 113 are based upon a battery or other relatively constant voltage. Typically these voltages 112, 113 will be designed to track each other with relatively little variation (e.g., no more than about 0.1-0.2%, although other embodiments may be designed with different parameters).

Each reference voltage 112, 113 is supplied to a terminal 104, 110 of processor 102 through a voltage divider circuit that includes a reduction resistor 114, 115 and a sensing resistor 116, 117 (respectively). In the embodiment shown in FIG. 1, resistors 114-117 are shown as implemented with conventional resistors to create a DC voltage divider that scales the reference voltage 112, 113 to a desired level. Generally speaking, the resistances of resistors 114 and 115 will be much larger than the resistances of the sensing resistors 116, 117 so that the reference values sensed at terminals 104, 110 are significantly lower than the applied voltages 112, 113. Reduction resistors 114, 115 may exhibit resistances of, for example, on the order or twenty or more times the resistances of sensing resistors 116, 117. Generally speaking, it is desirable to limit the design tolerances and variations allowed by resistors 114-117. In one embodiment, nominal tolerance of about +/−0.5% may be permitted, in addition to another +/−0.5% tolerance due to time, temperature and other factors, for a total tolerance of about +/−1%. Again, other embodiments may be designed with other tolerances, as desired.

For reasons that will become more apparent from the discussion below, it may be desirable in many embodiments to design the reference voltages 112, 113 and associated voltage divider circuit such that the nominal tolerance for the sensed reference voltages is greater than the permitted tolerance of the detected signals. Moreover, it will generally be desirable that the total tolerance of the reference voltage sensing mechanism be designed to be greater than the nominal tolerance of the reference voltages, and that the absolute voltage difference between the reference voltages 112, 113 be greater still. Each of these tolerances should be less than the ratio of reduction resistors 114, 115 to the sensing resistors 116, 117. Again, this concept is addressed more fully below.

Terminals 106, 108, 152, 154 of processor 102 are used to sense electrical characteristics such as voltage 134 and/or current 135. In the embodiment shown in FIG. 1A, the sensed voltage 134 is applied through a voltage divider made up of a reduction resistor 138 and a sensing resistor 140 to scale the received voltage (which may be quite high, in the case of a battery pack or the like) to a level that is within the range of the A/D features on terminals 106, 108. The scaled voltage may be further adjusted with a voltage signal configuration module 130, as desired. In various embodiments, configuration module 130 simply provides a pull-up or pull-down impedance connected to a suitable reference signal (e.g., ground) to prevent undesirable electrical transients and/or to further scale the received voltage to a desired level.

In the embodiment shown in FIG. 1B, current sensor 142 is any device, circuitry, logic or the like that is capable of providing an indication of current 135. In various embodiments, current sensor 142 is a conventional Hall Effect sensor. In other embodiments, current sensor 142 is simply a shunt circuit that passes current 135 through a known resistance to create a voltage output in accordance with Ohm's Law. In still other embodiments, current sensor 142 may be replaced (or supplemented) with one or more resistive sensors 144 such as thermistors and/or the like. In such embodiments, sensors 144 provide an output voltage that can be processed in the same manner as the output of current sensor 142.

The output(s) of current sensor 132 and/or sensors 144 may be configured in any manner prior to sensing. A current signal configuration circuit 132, for example, may provide pull-up or pull-down impedances and/or other scaling, similar to the voltage configuration circuit 130 described above. In various embodiments configuration circuit 132 simply provides a resistor or other impedance that allows for scaling or other adjustment into the voltage sensing range of terminals 106, 108.

Reliability and security of sensed data is greatly improved through redundancy. As a result, FIGS. 1A and 1B show the voltage signals and current signals both being applied to multiple terminals of processor 102. FIG. 1A, for example, shows the sensed voltage as being applied to both terminals 106 and 108; FIG. 1B similarly shows the sensed current being applied to terminals 152 and 154. As described more fully below, voltages and/or currents sensed on the two terminals can be analyzed with respect to separate references values received on terminals 104, 110 to compute ratiometric and other values that can be further analyzed to allow appropriate tolerances while detecting errors or other issues that may occur. Such analysis techniques are described with respect to FIGS. 3-5 below.

Signal conditioning circuits 118-121 are any circuits or other modules capable of further conditioning signals applied to the terminals of processor 102. In various embodiments, each circuit 118-121 includes a voltage storage element (e.g., a capacitor 126, 127, 128, 129) that is able to store electrical charge for subsequent sensing. Each circuit 118-121 also includes a voltage flow element (e.g., resistors 122, 123, 124, 125 in FIGS. 1A-B, although inductors could be equivalently used) that electrically isolates the voltage storage elements 126-129 from each other. Generally speaking, conditioning circuits 118-121 act as low-pass noise filters to improve the quality of signals applied to processor 102.

FIG. 1A shows that the voltage signal at node 146 is applied to both terminal 106 and 108 to provide redundancy and the ability to compute ratiometric values with respect to two different references values. Note that the splitting of the voltage signal takes place prior to conditioning circuits 118-121 to provide an added level of redundancy; that is, if any component in any single circuit 118-12 should fail, this issue would be detectable by the different values received at terminals 106, 108.

FIG. 1B similarly shows the current signal (represented by the voltage at node 148) being applied to both terminals 152 and 154 via circuits 119 and 121, respectively. This allows current measurements to be redundantly checked, similar to the voltage signal 146 described above. In an alternate embodiment shown in FIG. 2, however, two separate current sensors may be provided, with inputs from each sensor being provided to separate terminals 152, 154 in processor 102.

Figure 2:
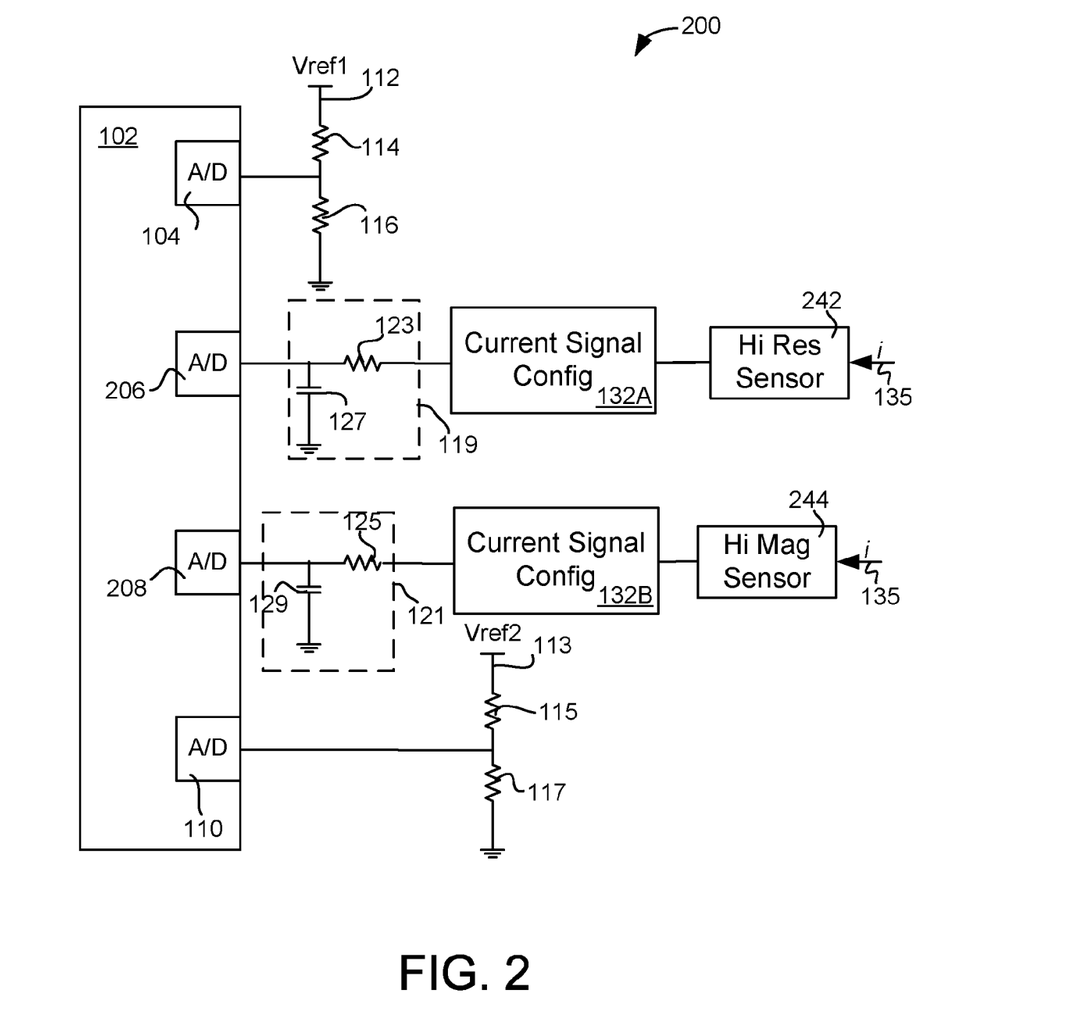
FIG. 2 is a circuit diagram of an alternate exemplary embodiment of a system for measuring and diagnosing electrical characteristics.

With reference now to FIG. 2, an exemplary system 200 for sensing current 135 from a battery pack or the like suitably includes a high-resolution current sensor 242 and a separate high-magnitude current sensor 244. Typically, high-magnitude sensor 244 will have a greater dynamic range than high-resolution sensor 242, but high-resolution sensor will provide improved accuracy/resolution not available from high-magnitude current sensor 244. In this embodiment, currents sensed on the two channels 152, 154 will not typically be directly compared to each other over the entire sensing range, but rather will only be compared over that portion of the sensing range in which the two sensors 242, 244 overlap, as described more fully below.

Although FIG. 2 does not show the voltage sensing circuitry for simplicity, voltage sensing may also be provided. Voltage sensing circuitry may be coupled to other terminals (e.g., terminals 106, 108 in FIG. 1A) in any manner to allow sensing of both current and voltage using a common set of references 112, 113.

Figure 3:
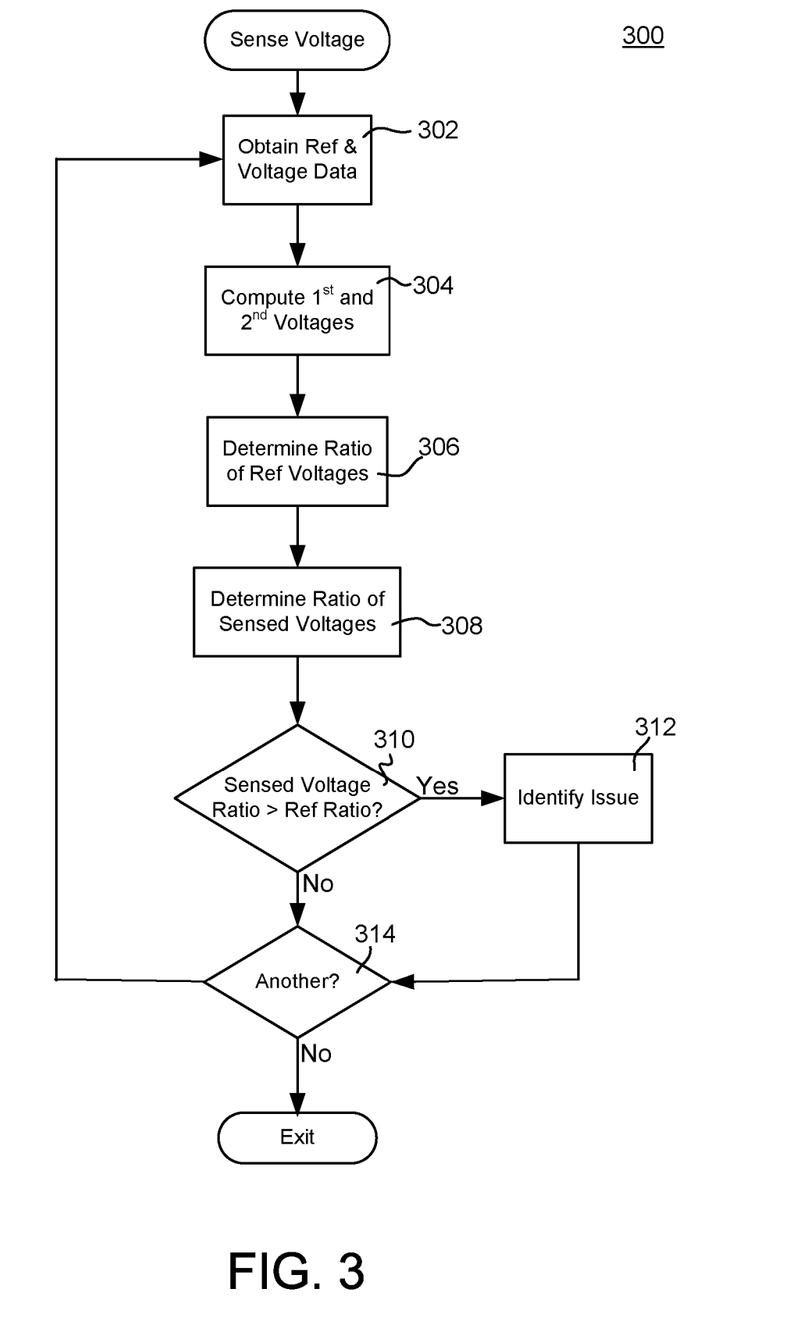
FIG. 3 is a flowchart of an exemplary process for evaluating voltage measurements.
Figure 4:
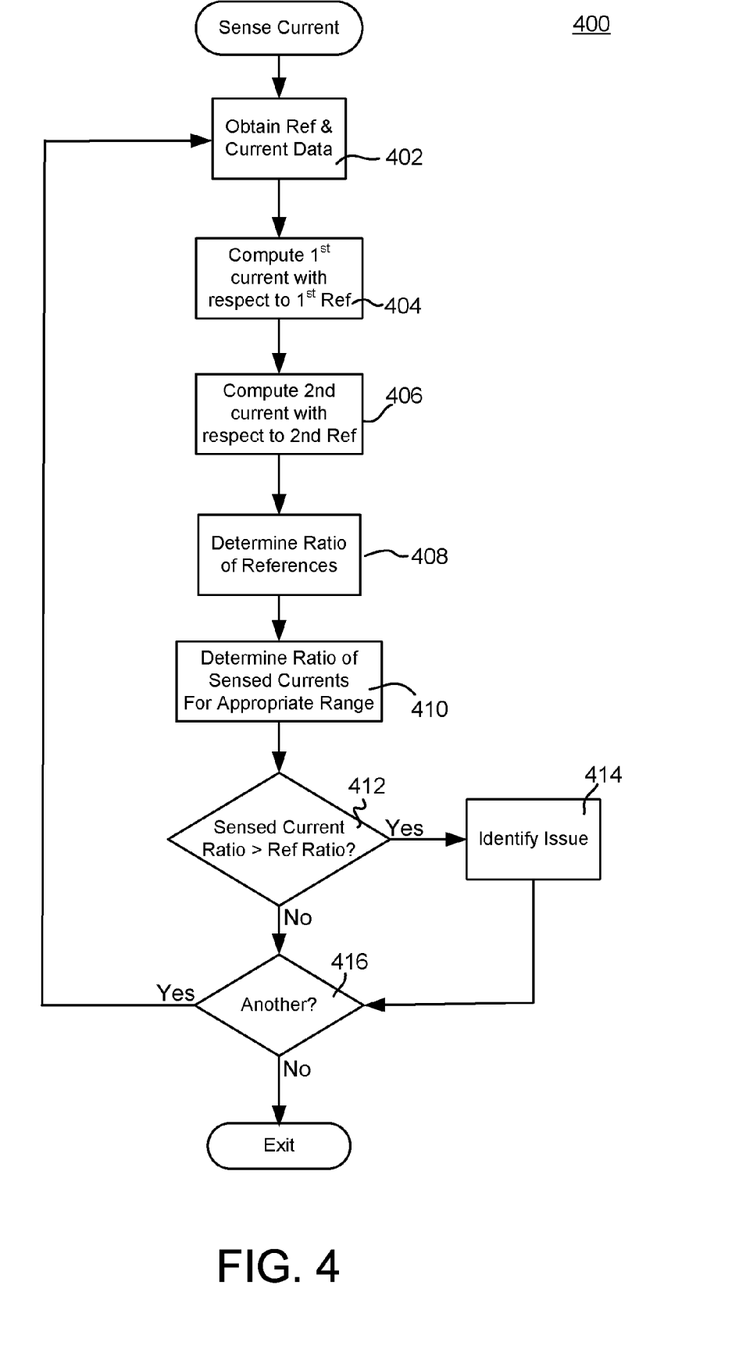
FIG. 4 is a flowchart of an exemplary process for evaluating current measurements.
Figure 5:
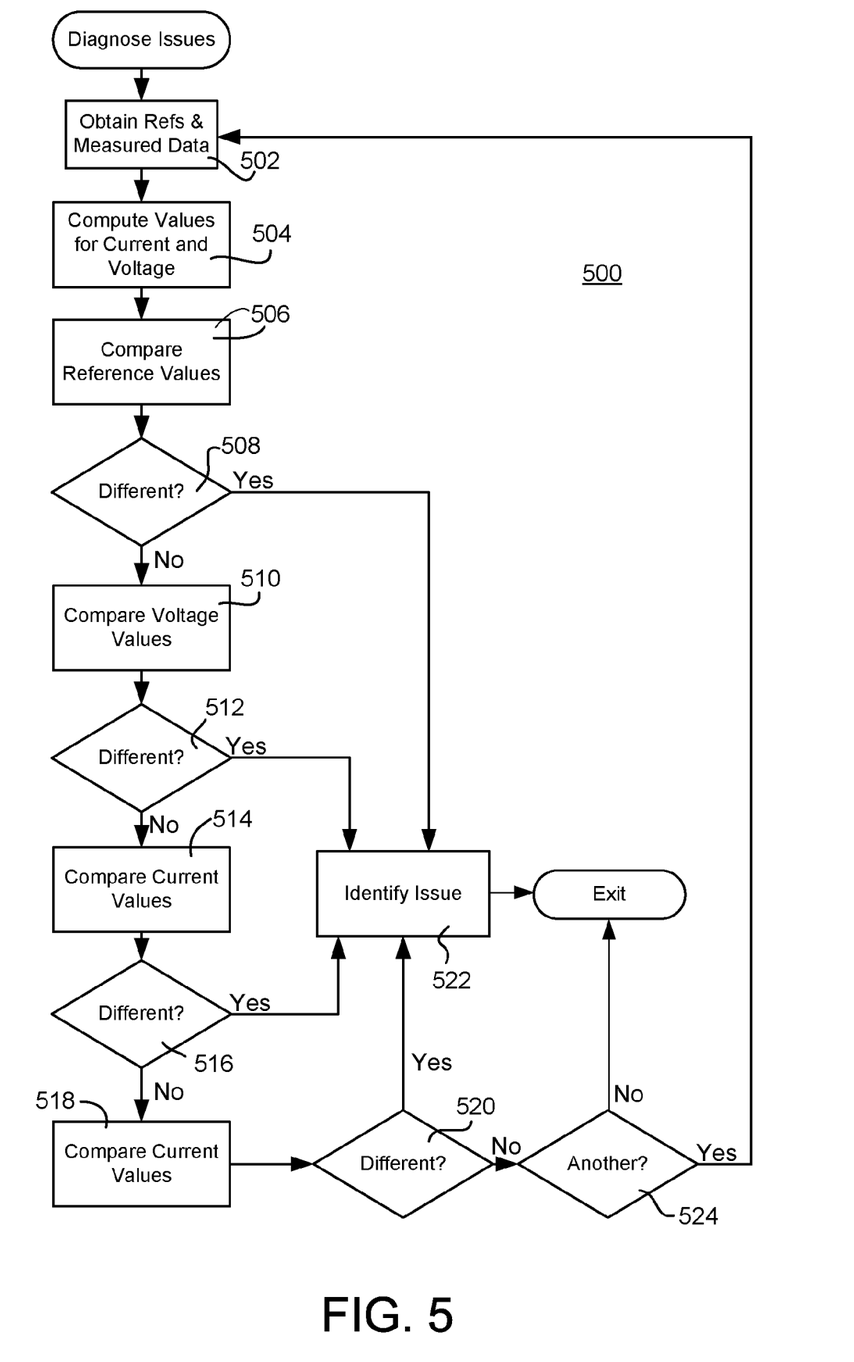
FIG. 5 is a flowchart of an exemplary process for identifying issues in measured electrical characteristics.

In operation, currents 135 and voltages 134 are sensed on the terminals of processor 102 using conventional sampling and A/D techniques commonly provided by many processors 102. The resulting values may be processed in any manner. FIGS. 3-5 show various techniques that allow for secure and reliable sensing of electrical characteristics, as well as effective identification of issues that may arise within systems 100/150/200 during operation.

The various steps shown in FIGS. 3-5 represent logic that may be executed in hardware, software, firmware or the like. In an exemplary embodiment, the various steps and features shown in FIG. 3 are implemented in software/firmware that is stored in flash or other memory associated with processor 102, and that can be executed by processor 102. Other embodiments may store software instructions in source or object code form on any digital storage medium, such as any sort of memory, portable media or mass storage, for execution by any processor or controller.

With reference now to FIG. 3, an exemplary technique for measuring voltage 134 suitably includes the broad steps of obtaining reference and voltage data (step 302), computing first and second values (step 304), and comparing (step 310) ratios of the first and second values (step 308) and of the reference voltages (step 306). If the ratio of the sensed voltages exceeds the ratio of the reference values (step 310), an issue is identified (step 312) within system 100. Processing repeats or otherwise continues as desired (step 314).

Reference and voltage measurements are obtained in any manner (step 302). In various embodiments, reference values are obtained using A/D measurements on terminals 104 and 110 (FIG. 1A) of processor 102, as described above. Voltage measurements from system 100 also obtained using separate A/D banks (e.g., terminals 106, 108) of processor 102.

In various embodiments, the measured voltage values are represented ratiometrically. That is, the measured voltages are expressed as a ratio to a reference (e.g., references 112, 113). This may be accomplished in various embodiments by simply dividing the measured voltage by the reference. For example, a voltage measured on terminal 106 (FIG. 1A) may be divided by the value of the reference measured on terminal 104, and the voltage measured on terminal 108 may be divided by the reference measured on terminal 110. By providing the configured voltage signal (e.g., the voltage at node 146 in FIG. 1A) to two terminals 106, 108 on processor 102, then, and expressing the measured voltages as ratios to references measured on terminals 104, 110, additional security and reliability can be built into system 100.

Additional security can be obtained by performing various comparisons of the measured signals. The measured and/or computed ratiometric voltage values may be compared to each other, for example, and an issue can be identified if they differ significantly (e.g., by more than a threshold amount). An issue can also be identified if the reference values measured on terminals 104 and 110 differ significantly. Still further, a ratio of the measured voltage values (e.g., the values measured on terminals 106, 108) may be determined (step 306) and compared to the ratio of the measured reference values measured on terminals 104, 110 (step 308). If the ratio of the measured voltage characteristics exceeds the ratio of the measured reference signals, then an issue can be identified (step 312) and addressed as appropriate.

"Issues" may refer to any sort of inconsistency, error or other non-conformity that is of interest. In various embodiments, issues are any conditions of interest that are identified from the various comparisons of redundant elements within system 100. Issues may result from mechanical or electrical variances due to defects, breakdown, environmental effects and/or other factors.

Issues may be addressed in any manner. In various embodiments, step 312 may involve taking a remedial action (e.g., initiating a shutdown or other modification to operation), providing a warning or other indication signal to an operator or controlling process, flagging one or more components for further analysis, making an entry into a data log, or any other actions as appropriate to the particular embodiment.

FIG. 4 shows an exemplary process 400 suitable for measuring current, such as current 135, using either of the systems 150, 200 shown in FIGS. 1B and 2. Process 400 suitably includes the broad steps of obtaining reference and data values (step 402), determining the current measurements on each terminal with respect to the observed references (steps 404, 406), determining ratios of the measured references and the measured current signals (steps 408, 410, respectively) and identifying an issue (step 414) if the sensed current ratio exceeds the reference ratio (step 412). Process 400 may be repeated or continued on any temporal basis (step 416).

Process 400 operates much like process 300 describe above, particularly in embodiments configured as in FIG. 1B, with a single current sensor ultimately providing a shunted signal to both sensing terminals 152 and 154. In such embodiments, the voltages applied at each of terminals 104, 152, 154, and 110 are digitized, with terminals 104 and 110 providing reference values and terminals 152, 154 providing values for the measured current. In embodiments configured with two current sensors 242, 244 as in FIG. 2, each sensor 242, 244 provides a current signal to one terminal 152, 154 (respectively) to allow multiple current measurements for redundancy.

Step 402, then, involves obtaining A/D inputs from each of the terminals 104, 152, 154, 110 to collect values for two reference signals and two current measurements. One of the current measurements may be expressed ratiometrically with a first one of the reference values (step 404), and the other measurement may be expressed ratiometrically with the other reference value (step 406). A ratio of the two reference values may also be computed (step 408).

Like process 300 above, process 400 allows for ratios of measured values to be compared to ratios of reference signals to identify issues (steps 412, 414). In embodiments that provide two different current sensors 242, 244, it may be desirable to compare values or ratios only when the current lies within a common range of sensitivity. That is, if sensor 244 has a greater dynamic range than sensor 242, it may not be desirable to compare measured current values that lie outside of the range of sensor 242. In embodiments where a single sensor 135 provides both current values, or wherein similar sensors 242, 244 are used, measurement and comparison can take place across the entire range of sensitivity for the sensor(s).

FIG. 5 shows an exemplary process 500 for diagnosing and identifying issues that may occur within a current and voltage measurement system. Process 500 begins with collecting data on terminals 104, 106, 108, 152, 154, and/or 110 to gather reference values, current values and/or voltage values that can be used in subsequent processing (step 502). Ratiometric values for the voltage and current measurements are determined as appropriate (step 504) from the measured values and the reference values. Two or more ratiometric voltage values may be calculated, for example, from the signals received on terminals 106 and 108 with respect to the reference voltages measured on terminals 104 and 110, respectively. Similarly, ratiometric values from one or more current sensors can be obtained using the techniques described above.

When data is gathered and processed, a number of comparisons can be performed to identify any issues that may have occurred (step 522). In various embodiments, the two reference values (e.g., the values measured on terminals 104 and 110) may be compared to each other (step 506), with any differences (step 508) identifying an issue. Computed voltage values (step 510) may also be compared to each other to identify any differences (step 512), as can computed current values (step 514), provided that the current sensed is within the range of both current sensors 242, 244 in embodiments that provide multiple sensors 242, 244 with different ranges of sensitivity. Any differences in the current measurement (step 516) can identify an issue as appropriate. Moreover, ratios of voltage measurements, current measurements and/or reference signal measurements may be further compared (step 518), with differences (step 520) indicating an issue as appropriate.

The various differences recognized in steps 508, 512, 516 and 520 may account for some level of tolerance; that is, no issue is generally identified if the difference between the two values is less than a threshold level. The particular threshold used may vary significantly from embodiment to embodiment, and may be effectively zero (e.g., little or no difference tolerated) in some embodiments.

As noted above, issues may be identified and addressed in any manner (step 522), such as by providing an indicator output signal, directing a control process to shutdown or otherwise adjust operation, or the like. Process 500 may repeat or continue on any temporal basis, as desired (step 524).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A method of identifying issues associated with sensing of electrical characteristics of a sensed signal transmitted on an electrical conductor, wherein the method is performed in a processor having first, second, third and fourth terminals each representing separate input pins of the processor, the method comprising:
receiving a first reference voltage at the first terminal and a second reference voltage that is separately received at the second terminal, wherein the first and second reference voltages are references for measurement of the electrical characteristics that are received on separate input pins of the processor, and wherein the first and second reference voltages are substantially equal to each other and are substantially unchanging during normal operation;
obtaining first data about the electrical characteristics of the sensed signal from the third terminal and redundant second data about the electrical characteristics of the sensed signal from the fourth terminal, wherein the first data and the redundant second data both represent the measured electrical characteristics of the same sensed signal received on separate input pins of the processor that are separately electrically coupled to the electrical conductor transmitting the sensed signal;
computing, using the processor, a first computed value of the electrical characteristics of the sensed signal based upon the first data and the first reference voltage and a second computed value of the electrical characteristics based upon the second data and the second reference voltage;
determining, using the processor, a reference ratio of the first reference voltage received at the first terminal of the processor to the second reference voltage separately received at the second terminal of the processor, and a value ratio of the first computed value received at the third terminal of the processor to the second computed value received at the fourth terminal of the processor;
comparing the reference ratio to the value ratio using the processor; and
identifying an issue if the value ratio exceeds the reference ratio.

2. The method of claim 1 further comprising comparing the first and second computed values to each other, and identifying the issue if the first and second computed values differ.

3. The method of claim 2 further comprising comparing the first and second reference voltages to each other, and identifying the issue if the first and second computed values differ.

4. The method of claim 1 further comprising comparing the first and second reference voltages to each other, and identifying the issue if the first and second computed values differ.

5. The method of claim 1 wherein the identifying step comprises outputting a signal when the issue is identified.

6. The method of claim 1 wherein the first and second computed values of the electrical characteristics are computed ratiometrically.

7. The method of claim 1 wherein the electrical characteristics comprise a voltage measurement representing a voltage of the sensed signal.

8. The method of claim 1 wherein the electrical characteristics comprise a current measurement of the sensed signal.

9. The method of claim 8 wherein the first data about the current measurement and the second data about the current measurement are obtained from a common current sensor.

10. The method of claim 8 wherein the first data about the current measurement is obtained from a first current sensor and the second data about the current measurement is obtained from a second current sensor different from the first current sensor, wherein the first and second current sensors have different ranges of sensitivity.

11. The method of claim 10 wherein the determining of the value ratio comprises determining the ratio over the range of sensitivity associated with one of the first and second current sensors.

12. A method of diagnosing issues in sensing electrical characteristics of a sensed signal propagating in an electrical conductor, wherein the electrical characteristics comprise a current and a voltage of the same sensed signal measured by a processor having a plurality of terminals, the method comprising:
obtaining a first reference value, a second reference value, a first voltage measurement, a second voltage measurement, a first current measurement, and a second current measurement each on separate input pins of the processor, wherein the first and second voltage measurements represent the voltage of the same sensed signal and the first and second current measurements represent the current of the same sensed signal, wherein the first and second reference values are determined from reference voltages separately received on first and second input pins of the processor, and wherein the first and second voltage measurements and the first and second current measurements are each received on separate input pins of the processor that are each separately electrically coupled to the electrical conductor in which the sensed signal propagates;
computing, using the processor, a first value of the voltage based upon the first voltage measurement and the first reference voltage, a second value of the voltage based upon the second voltage measurement and the second reference voltage, a first value of the current based upon the first current measurement and the first reference voltage, and a second value of the current based upon the second current measurement and the second reference voltage;
using the processor, comparing the first reference value to the second reference value, and identifying an issue if the first and second reference values differ;
using the processor, comparing the first and second values of the voltage, and identifying the issue if the first and second values of the voltage differ;
using the processor, comparing the first and second values of the current, and identifying the issue if the first and second values of the current differ; and
using the processor, comparing a value ratio of the first and second voltages to a reference ratio of the first and second reference voltages, and identifying the issue in sensing the electrical characteristics of the sensed signal if the value ratio exceeds the reference ratio.

13. The method of claim 12 wherein the first value of the voltage and the first value of the current are each ratiometric values determined with respect to the first reference voltage, and wherein the second value of the voltage and the second value of the current are each ratiometric values determined with respect to the second reference voltage.

14. The method of claim 12 wherein the first and second values of are compared over a limited range.

15. A system for measuring an electrical characteristic of a sensed signal propagating in an electrical conductor, the system comprising:
- a processor having a first terminal, a second terminal, a third terminal and a fourth terminal, wherein each of the first, second, third and fourth terminals are separate input pins of the processor;
- a first reference voltage circuit configured to apply a first reference voltage to the first terminal of the processor, wherein the first reference voltage circuit comprises a first reduction resistor and a first sensing resistor configured as a voltage divider;
- a second reference voltage circuit configured to apply a second reference voltage to the second terminal of the processor, wherein the second reference voltage circuit comprises a second reduction resistor and a second sensing resistor configured as a voltage divider, and wherein the first and second reference voltages represent reference values used in the measurement of the;
- a first signal conditioning circuit electrically coupled to the electrical conductor to receive the sensed signal and to provide a first conditioned sensed signal to the third terminal of the processor; and
- a second signal conditioning circuit separately electrically coupled to the electrical conductor to receive the sensed signal and to provide a second conditioned sensed signal to the fourth terminal of the processor;
- wherein the processor is configured to separately measure the electrical characteristics of the same sensed signal using the first conditioned sensed signal received at the third terminal and using the second conditioned sensed signal received at the fourth terminal and wherein the processor is configured to compute first and second ratiometric values of the electrical characteristics of the sensed signal, wherein the first ratiometric value is based upon a measurement obtained from the third terminal and the first reference voltage and wherein the second ratiometric value is based upon a measurement obtained from the fourth terminal and the second reference voltage, and wherein the processor is further configured to identify an issue with the measuring of the electrical characteristics if a ratio of the first ratiometric value to the second ratiometric value exceeds a ratio of the first reference value to the second reference value.

16. The system of claim 15 wherein the resistances of the first and second reduction resistors are larger than the resistances of the first and second sensing resistors, respectively.

17. The system of claim 15 wherein the resistances of the first and second reduction resistors are at least twenty times greater than the resistances of the first and second sensing resistors, respectively.

18. The system of claim 15 further comprising a current sensor coupled to provide a current signal to the third and fourth terminals of the processor, and wherein the processor is further configured to measure the current signal at the third and fourth terminals and to compute first and second ratiometric values of the current signal, wherein the first ratiometric value of the current signal is based upon a measurement obtained from the third terminal and the first reference voltage and the second ratiometric value of the current signal is based upon a measurement of obtained from the fourth terminal and the second reference voltage, and wherein the processor is further configured to identify an issue if a ratio of the first ratiometric value of the current signal to the second ratiometric value of the current signal exceeds the ratio of the first reference value to the second reference value.

19. The system of claim 15 further comprising a first current sensor coupled to provide a first current signal to the third terminal of the processor and a second current sensor coupled to provide a second current signal to the fourth terminal of the processor, and wherein the processor is further configured to measure the first and second current signals at the third and fourth terminals, respectively, and to compute first and second ratiometric values of the current signal, wherein the first ratiometric value of the current signal is based upon a measurement obtained from the third terminal and the first reference voltage and the second ratiometric value of the current signal is based upon a measurement of obtained from the fourth terminal and the second reference voltage, and wherein the processor is further configured to identify an issue if a ratio of the first ratiometric value of the current signal to the second ratiometric value of the current signal exceeds the ratio of the first reference value to the second reference value.

20. The system of claim 19 wherein the first and second current signals are compared over a limited range.

* * * * *